United States Patent [19]

Schink

[11] Patent Number: 4,839,607

[45] Date of Patent: Jun. 13, 1989

[54] FREQUENCY-DOUBLING AMPLIFYING SURFACE WAVE RECEIVER

[75] Inventor: Helmut Schink, Munich, Fed. Rep. of Germany

[73] Assignee: Siemens Aktiengesellschaft, Berlin and Munich, Fed. Rep. of Germany

[21] Appl. No.: 245,371

[22] Filed: Sep. 16, 1988

[30] Foreign Application Priority Data

Sep. 29, 1987 [DE] Fed. Rep. of Germany ....... 3732858

[51] Int. Cl.[4] ............................................... H03F 7/00

[52] U.S. Cl. ....................................... 330/5.5; 330/4.6

[58] Field of Search .................. 307/424; 330/4.5, 4.6, 330/5, 5.5; 333/150, 154, 193

[56] References Cited

U.S. PATENT DOCUMENTS 4,233,530 11/1980 Mikoshiba et al. .............. 330/5.5 X

OTHER PUBLICATIONS

Article, "Monolithic GaAs Acoustic Charge Transport Devices", by Hoskins et al, 1982, Ultrasonics Symposium, pp. 456–460.

*Primary Examiner*—Steven Mottola
*Attorney, Agent, or Firm*—Hill, Van Santen, Steadman & Simpson

[57] ABSTRACT

An amplifying surface wave receiver for a surface wave element composed of a material which has the piezo effect and which can be rendered electrically conductive by local doping wherein a doped region is formed at the upper portion of an insulating substrate body (8) which forms the surface wave element and said doped region forms a conductive channel (7) between at least two contact electrodes (3, 3') which have a defined distance from each other and in the channel thus formed the occurring piezo charges are positioned so as to modulate the conductivity of the channel. One pole terminal of a voltage source (4) is connected to one of the contact electrodes (3) and the other pole terminal is connected to the other contact electrode (3') through an alternating current detector (5).

6 Claims, 1 Drawing Sheet

2
I≈
VOLTAGE SOURCE
1
3
"1"
"2"
3
CONTACT
4
5
PIEZO CHARGES

FIG 1A
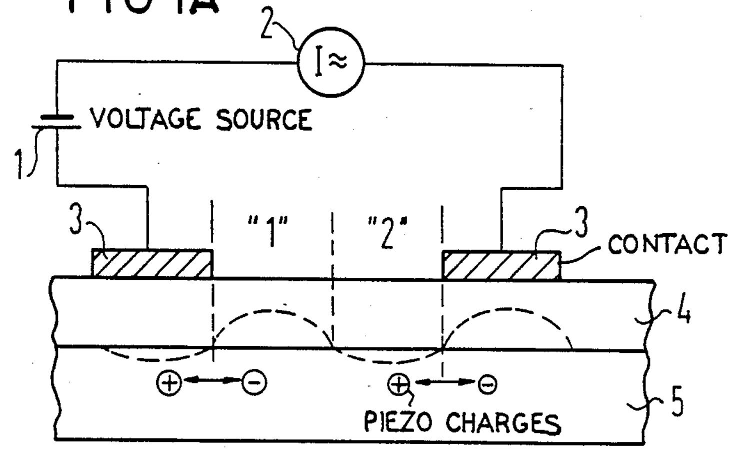
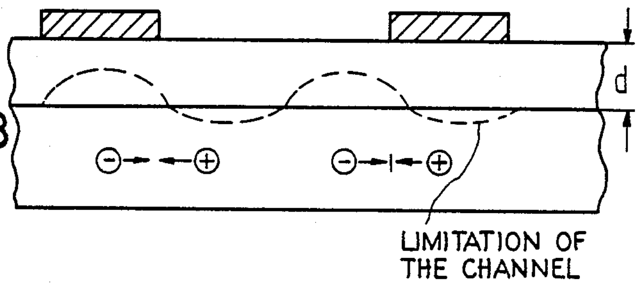
FIG 1B
FIG 2A
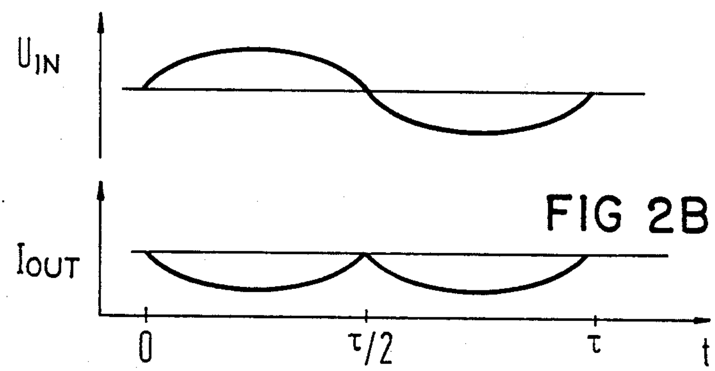
FIG 2B

FREQUENCY-DOUBLING AMPLIFYING SURFACE WAVE RECEIVER

CROSS REFERENCES TO RELATED CASES

This case is related to the application entitled "AN AMPLIFYING SURFACE WAVE RECEIVER" identified in the attorney's records as Case No. P88,1437 in which the inventors are Helmut Schink and Ralf-Dieter Schnell assigned to the assignee of the present case.

BACKGROUND OF THE INVENTION

1. Field of the Invention

The present invention relates to a frequency-doubling, amplifying surface wave receiver for a surface wave device which is formed of a material that has the piezo effect and which can be rendered electrically conductive by local doping.

2. Description of the Related Art

Known piezo electric transducers are composed of a substrate member of insulating material which exhibits the piezo effect. Two metallic contact electrodes are applied to the surface of a substrate body at predetermined intervals, and the contact electrodes are respectively connected to terminals of an alternating voltage detector. The operating mode of such an arrangement is disclosed, for example, in IEEE 1982 Ultra Sonics Symposium, pages 456 through 460, Michael J. Hoskins and Bill J. Hunsinger, "Monolithic GaAs Acoustic Charge Transport Devices".

Such a known arrangement has the disadvantage in that the amplitude of the signal voltage which is available at the two contact electrodes is small because of the low energy content of the signals which are picked-up, so that the signal must be reamplified after it has been coupled out and must be matched to corresponding, further-processing devices. Depending on the application, this may lead to difficulties. In any case, however, it leads to a relatively expensive technological outlay. Further, a harmonic of the fundamental oscillation of the surface wave element that occurs cannot be detected.

SUMMARY OF THE INVENTION

In surface wave components, the signals passing through the component are coupled out with transducer structures. Such transducer structures are generally composed of metallic paths which are arranged on an insulating substrate. Due to the piezo effect, the surface wave couples charges into the body of the surface wave component and these comprise the signal. The energy content of these signals, however, is relatively low, so that the signal must be re-amplified after being coupled out and the signal must be matched to corresponding, further-processing electronic components.

The recognition of surface wave components requires the detection of both the fundamental wave which has a frequency of f as well as of the harmonic which has the frequency of 2f. The manufacture of components that have active suppression or amplification of harmonics requires the monolithic integration of frequency-doubling components. The drive of further transducer structures requires high signal levels.

The present invention has an object to create a frequency-doubling, amplifying receiver for surface waves which allows a harmonics having a frequency of 2f of the fundamental wave which has a frequency of f to be recognized in a simple manner and with which the required amplification of the signal traversing the surface wave component can be achieved.

The object of the present invention is achieved with a frequency-doubling, amplifying surface wave receiver.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 1A is a schematic illustration of a preferred exemplary embodiment of the surface wave receiver of the invention;

FIG. 1B is a schematic illustration of the invention at a later time;

FIG. 1C illustrates the excitation voltage; and

FIG. 2 is a diagram of the chronological curve of current at the contact electrodes of the surface wave element.

DESCRIPTION OF THE PREFERRED EMBODIMENTS

FIG. 1A, is a schematic illustration of a preferred exemplary embodiment of the present invention.

A frequency-doubling, amplifying surface wave receiver is shown for a surface wave element composed o a material which has the piezo effect such as GaAs and that can be rendered electrically conductive by local doping. Formed at the upper portion of an insulating substrate body 5 of the material and forming the surface wave element is a doping region which forms the conductive channel 4 between two contact electrodes 3, 3'. Electrodes 3 and 3' are separated a defined distance from each other in the conductive channel 4 such that piezo charges which occur are positioned so as to modulate the conductivity of this channel 4. One terminal of a voltage source 1 is connected to the contact electrode 3 and the other pole terminal of source is connected to the other contact electrode 3' through an alternating current detector 2. The distance D between the contact electrodes 3 and 3' is such that the condition $D \geqq \lambda$ is met, where $\lambda$ is the wavelength of the occurring surface wave Thus, the distance D has a size such that at least one complete wave is spaced between the contact electrodes 3 and 3'.

The voltage source 1 is preferably a direct voltage source but, alternatively, can also be an alternating voltage source which has a frequency with a prescribed relationship to the frequency of the surface waves. The contact electrodes 3 and 3' are preferably composed of a metallic material, such as for example aluminum. The alternating current detector 2 can be formed in a variety of ways. It is preferably formed as a current-detecting semi-conductor arrangement which is formed on the surface of substrate body 5 as an integral component of the surface wave element.

In the illustration of FIGS. 1A and 1B, the variations of the depth d of the conductive channel due to the control influence of the occurring piezo electric charges are shown schematically in broken lines. Due to the variation or, respectively, modulation of the conductive channel, the resistance will be changed, so that, depending on the amplitude of the voltage of the voltage source 1, the current in the circuit formed by the circuit will be a rippled direct current or an alternating current and such ripple direct current or alternating current can be detected in a known manner by the alternating current detector 2. The piezo charges act in a way similar to the gate charges in a MESFET or MOSFET. The amplification factor thus depends both on the geometrical dimensions as well as on the electrical dimensions.

Frequency doubling is achieved by suitably selecting the dimension between the electrodes. In FIG. 1, D=λ is assumed where D is the distance between the electrodes and is the wavelength of the electrical wave. The contact electrodes 3 and 3' are placed such that, with a standing wave, the inside edges of the contact electrodes are at oscillation nodes. The time curve of the current is shown in FIG. 2B and with the voltage curve shown in FIG. 2A at the electrodes which excite the wave. At time 0, the conductivity of the channel is not modulated as compared to its steady-state. At $\tau/4$, the piezo charges constrict that part of the channel indicated by (1) in FIG. 1A. The part "2" is simultaneously driven positive. When a high voltage is adjacent the contacts then the electrons in the region "1" reach their saturation speed, then the current flux is determined only by the constricted part of the channel. The quiescent current flows again at time $\tau/2$. The time $3\ \tau/4$ is identical to the time $\tau/4$. The constriction of the channel, however, occurring in part "2" as shown in FIG. 1B. The current flowing between the contacts thus has twice the frequency of the exciting wave.

The surface wave component of the invention can be realized on all substrate materials that, (1) exhibit the piezo effect and, (2) can be rendered electrically conductive by local doping. A preferable material to be employed is, as already mentioned, GaAs.

The present invention is not limited to the illustrated exemplary embodiment. Modification of the exemplary embodiment can be done by a person having ordinary skill in the art without having to depart from the general concept of the invention or the protective scope as defined by the appended claims.

I claim as my invention:

1. A frequency-doubling, amplifying surface wave receiver for a surface wave element formed of a material which has the piezo effect and which can be rendered electrically conductive by local doping or by applying a conductive layer, characterized in that a region is formed at the upper portion of an insulating substrate body (5) to form a surface wave element and composed of material that has a piezo-electric effect, said region forming a conductive channel (4) between two contact electrodes (3, 3') such that piezo charges occurring are positioned so as to modulate the conductivity of said channel (4); and the distance D between said contact electrodes (3, 3') is at least as large as a complete surface wave which has the length λ such that the condition $$D \geqslant \lambda$$

exists, and a voltage source (1) with one side connected to one of said contact electrodes (3), and an other side of said voltage source (1) is connected to the other of said contact electrode (3') through an alternating current detector (2).

2. A surface wave receiver according to claim 1, characterized wherein said material is GaAs.

3. A surface wave receiver according to claim 1 or 2, wherein said two contact electrodes (3, 3) are formed of metallic material.

4. A surface wave receiver according to claim 1 or 2, wherein said voltage source (1) is a DC voltage source.

5. A surface wave receiver according to claim 1 or 2, wherein said voltage source (1) is an AC voltage source which has a frequency with a prescribed relationship to the frequency of the surface waves.

6. A surface wave receiver according to claim 2, wherein said alternating current detector (2) is a semiconductor arrangement which is formed to said substrate body (5) as an integral component part of the surface wave element.

* * * * *